United States Patent
Hofland

[11] Patent Number: 5,831,788
[45] Date of Patent: Nov. 3, 1998

[54] CIRCUIT CONNECTOR

[75] Inventor: Jonathan C. Hofland, San Jose, Calif.

[73] Assignee: Quantum Corporation, Milpitas, Calif.

[21] Appl. No.: 884,099

[22] Filed: Jun. 27, 1997

[51] Int. Cl.$^6$ .................................................. G11B 17/02
[52] U.S. Cl. .......................................................... 360/97.01
[58] Field of Search ................................ 360/97.01, 106; 439/67, 876; 174/94, 117 F, 117 FF, 250; 228/180.22, 234.1

[56] References Cited

U.S. PATENT DOCUMENTS

| | | | |
|---|---|---|---|
| 5,489,804 | 2/1996 | Pasch | 228/180.22 |
| 5,631,786 | 5/1997 | Erpelding | 360/106 |
| 5,644,448 | 7/1997 | Suzuki | 360/106 |
| 5,644,452 | 7/1997 | Cox et al. | 360/106 |
| 5,668,684 | 9/1997 | Palmer et al. | 360/106 |
| 5,678,287 | 10/1997 | Smith et al. | 228/180.22 |

*Primary Examiner*—Robert S. Tupper
*Attorney, Agent, or Firm*—Nydegger & Associates; Debra A. Chun

[57] ABSTRACT

A circuit connector for connecting a flex inter-connect circuit to an electronic circuit is provided herein. The flex inter-connect circuit includes a trace which is substantially enclosed within an insulator and a first pair of opposed inter-connect apertures which extend substantially through the insulator to the trace. The circuit connector includes a first pair of substantially opposed bumps which are bonded to the trace and extend from the inter-connect apertures. A coating of fusible material covers a portion of one of the bumps and bonds the circuit connector to the electronic circuit. As provided herein, the substantially opposed bumps provide good heat transfer to the fusible material so that a lower temperature can be used to bond the circuit connector to the electronic circuit.

20 Claims, 4 Drawing Sheets

CIRCUIT CONNECTOR

FIELD OF THE INVENTION

The present invention relates generally to disk drives for storing data. More specifically, the present invention relates to a circuit connector for connecting a circuit board to a flexible inter-connect circuit and the flexible inter-connect circuit to a flexure of a disk drive.

BACKGROUND

Disk drives are widely used in computers and data processing systems for storing information in digital form. In conventional Winchester disk drives, a transducer assembly "flies" upon an air bearing or cushion in very close proximity to a storage surface of a rotating data storage disk. The transducer assembly is supported proximate the storage surface using an actuator arm. A voice coil motor moves the actuator arm along a predetermined path to accurately position the transducer assembly relative to the storage surface.

The storage surface carries a thin film of magnetic material having a multiplicity of magnetic storage domains. Information may be recorded and/or read back from the storage domains by a data transducer of the transducer assembly.

Traditionally, tubes and wires were connected from the transducer assembly, along an edge of the actuator arm, to a read/write (R/W) flex circuit board, or flex printed circuit board (FPCB). Recently, however, transducer assemblies have been constructed to include a flexure with integrated wiring, which is electrically connected to the data transducer. Additionally, the flexure is electrically connected to a flexible, or flex, inter-connect circuit (FIC) which in turn is electrically connected to the R/W flex circuit board. The R/W flex circuit board is electrically connected to disk drive printed circuit board (PCB) which interfaces with the computer or word processor. Thus, information from the data transducer is transmitted through the flexure, the flexible inter-connect circuit, or FIC, and the R/W flex circuit board to the disk drive PCB and eventually to the computer.

A typical flexible inter-connect circuit includes a plurality of small, spaced apart, conductive traces which are covered with an electrical insulator. Because of the size constraints of present disk drives, it is often difficult to electrically connect the flexure to the flexible inter-connect circuit, and the flexible inter-connect circuit to the R/W flex circuit board.

One way of connecting the flexible inter-connect circuit includes creating an inter-connect aperture in the insulator to expose one (1) of the traces. Next, a circuit connector, i.e., a bump of conductive material is deposited into the inter-connect aperture. Subsequently, the bump is coated with a fusible material. The coated bump is then placed against the circuit board or the flexure and a heat source is applied to the electrical insulator substantially opposite the bump until the fusible material melts. Upon re-cooling, the fusible material bonds the bump to the circuit board or the flexure.

However, this type of circuit connector has not proved to be entirely satisfactory. Because the electrical insulator acts as a thermal insulator, a relatively high temperature is often required to melt the fusible material. The high temperature, for an extended period of time, can result in thermal damage to the flexible inter-connect circuit, the flexure, the circuit board, and/or surrounding components. Further, the resulting bond is often weak and difficult to rework.

In light of the above, it is an object of the present invention to provide a reliable, strong, and simple circuit connector. Another object of the present invention is to provide a circuit connector which can be reworked without damaging the flex inter-connect circuit, the flexure, and/or the flex circuit board. Still another object of the present invention is to provide a circuit connector which does not require a relatively high temperature to bond. Yet another object of the present invention is to provide a circuit connector which can be used as a place for an electrical test.

SUMMARY

The present invention is directed to a circuit connector which satisfies these objectives. The circuit connector is useful for electrically connecting a flex inter-connect circuit to an electrical circuit. More specifically, the circuit connector is useful for electrically connecting a R/W flex circuit board of a disk drive to the flex inter-connect circuit and the flex inter-connect circuit to a flexure of a disk drive.

As provided herein, the flex inter-connect circuit includes a trace which is substantially enclosed within an insulator and a first pair of substantially opposed inter-connect apertures which extend substantially through the insulator to the trace. The circuit connector includes a pair of substantially opposed bumps and a coating of fusible material which covers at least a portion of one (1) of the bumps. Each bump is disposed in one (1) of the opposed inter-connect apertures and contacts the trace. The fusible material, when heated with a heat source and subsequently cooled, bonds one (1) of the bumps to the electronic circuit.

As described in detail below, the substantially opposed bumps of the present circuit connector provide excellent heat transfer from the heat source to the fusible material proximate the electronic circuit. As a result of the excellent heat transfer, a lower temperature heat source can be used to form the bond, and there is less chance of thermal damage to the electronic circuit or the flex inter-connect circuit. Further, the resulting bond is more reliable and the heat source can be used to unbond the circuit connector. Moreover, one (1) of the bumps can be used as a test spot to electrically test the circuit.

For a typical disk drive, the flex inter-connect circuit includes a plurality of traces which are substantially enclosed within the insulator. Each trace can include a plurality of pairs of substantially opposed inter-connect apertures, which extend substantially through the insulator to the trace. Further, each trace can include a plurality of circuit connectors, i.e., opposed bumps, coated with a fusible material, which are positioned in the interconnect apertures.

The FICs, the R/W FPCB, and the flexures together form a read/write circuit which electrically connects data transducers to a disk drive PCB. The read/write circuit is usually positioned proximate an actuator arm of an actuator assembly for the disk drive.

Further, the present invention includes a method for connecting the electronic circuit to an FIC and a method for making a circuit connector.

Importantly, each circuit connector includes a pair of substantially opposed bumps and a coating of fusible material. Thus, heat applied to one (1) of the bumps efficiently transfers to the coating of fusible material adjacent the electronic circuit. Thus, a lower temperature heat source can be used to melt the fusible material.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
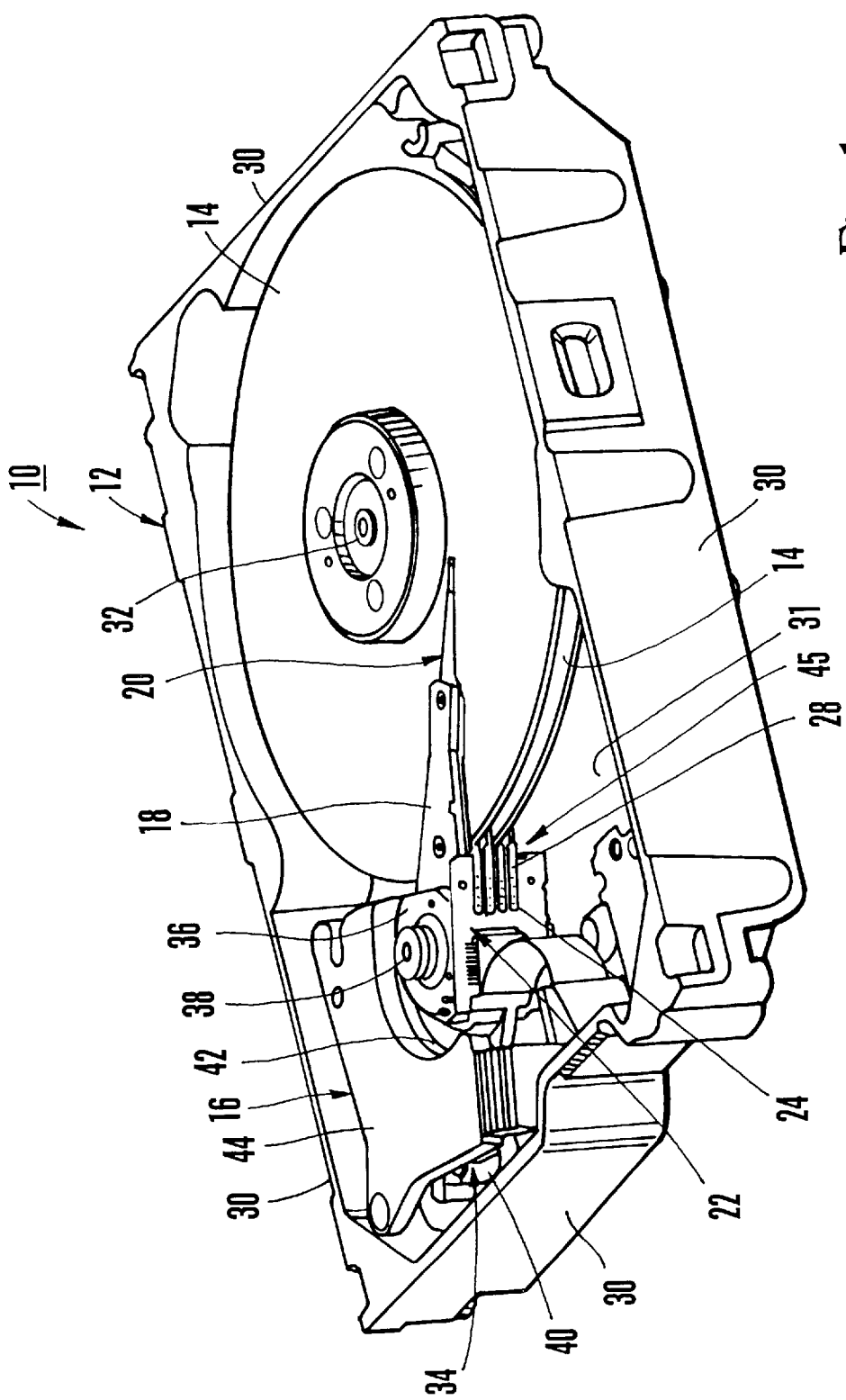
FIG. 1 is a perspective view of a disk drive including a circuit connector having features of the present invention.

Referring initially to FIG. 1, a disk drive 10 according to the present invention includes: (i) a drive housing 12; (ii) a plurality of spaced apart, rotating storage disks 14; (iii) an actuator assembly 16 including a plurality of actuator arms 18 for positioning a transducer assembly 20 proximate each side of each storage disk 14; and (iv) a read/write flex circuit, or read/write flex circuit board (R/W FPCB) 22.

The read/write flex circuit 22 electrically connects transducer assembly 20 to external drive electronics (drive PCB, not shown), which then connect to a computer (not shown) or a word processor (not shown). The read/write FPCB 22 includes electronics for a read/write channel, and a plurality of bonding pads (not shown) to which a flexible inter-connect circuit(s), FIC(s), 28 is connected. As provided in detail below, the unique design of a circuit connector 24, which in a preferred embodiment is part of the FIC, allows for better heat transfer during the bonding process connecting the FICs 28 to the read/write flex circuit board 22. This results in more reliable connections and less potential for heat damage to the R/W flex circuit board 22 and/or the FIC 28.

A detailed description of the various components of a disk drive 10 is provided in U.S. Pat. No. 5,208,712, issued to Hatch et al., and assigned to Quantum Corporation, the assignee of the present invention. The contents of U.S. Pat. No. 5,208,712 are incorporated herein by reference. Accordingly, only the structural aspects of a disk drive 10 which are particularly significant to the present invention are provided herein.

The drive housing 12 retains the various components of the disk drive 10. The drive housing 12, shown in FIG. 1, includes four (4) side walls 30. A typical drive housing 12 also includes a cover (not shown for clarity) and a base 31, which are spaced apart by the side walls 30. The disk drive 10 is typically installed in the case of the computer (not shown).

Each storage disk 14 stores data in a form that can be subsequently retrieved if necessary. A magnetic storage disk 14 is commonly used to store data in digital form. Alternately, for example, the storage disk 14 can be optical or magneto-optical. For conservation of space, each storage disk 14 preferably includes a data storage surface on each side of the storage disk 14. Those skilled in the art will recognize that the present invention is capable of being used in a disk drive 10 having any number, or size, of storage disks 14. The storage disks are typically rotated by a disk spindle 32 that is journalled to the drive housing 12.

The actuator assembly 16 includes the actuator arms 18 for retaining the transducer assemblies 20 proximate the storage disks 14 and a voice coil motor 34 for moving the actuator arms 18 relative to the storage disks 14. In the embodiment shown in FIGS. 1 and 2, the actuator arms 18 are attached to and cantilevered from an actuator hub 36. In this embodiment, the actuator hub 36 is mounted on an actuator bearing assembly (not shown) to an actuator shaft 38 (shown in FIG. 1). The bearing assembly enables rotation of the actuator assembly 16 about the actuator shaft 38.

The voice coil motor 34 precisely moves the actuator arms 18 and the transducer assemblies 20 relative to the storage disks 14. The voice coil motor 34 can be implemented in a number of alternate ways known by those skilled in the art. For example, the voice coil motor 34 can be a rotary voice coil motor or a linear voice coil motor. In the embodiment shown in FIGS. 1 and 2, the voice coil motor 34 is a rotary voice coil motor 34. In this embodiment, activation of the voice coil motor 34 rotates the actuator hub 36 and moves the actuator arms 18 and transducers 20 relative to the storage disks 14.

Figure 2:
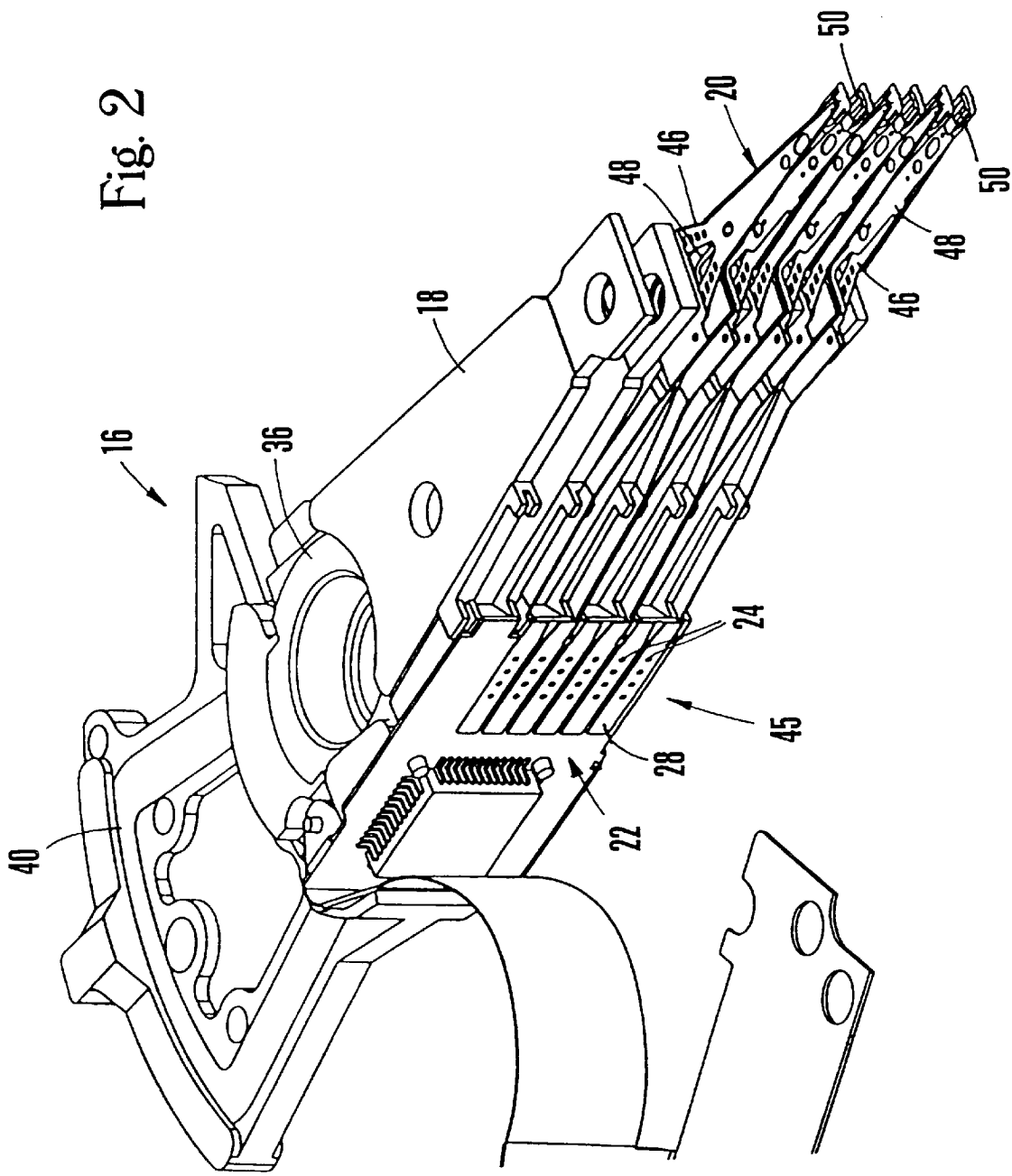
FIG. 2 is a perspective view of a portion of a disk drive including a circuit connector having features of the present invention.

As can best be seen in FIG. 2, the rotary voice coil motor 34 can include a flat, trapezoidal coil 40 that is attached to the actuator hub 36. Referring back to FIG. 1, the coil 40 is disposed between a pair of spaced apart permanent magnets 42 (only one (1) magnet 42 is shown) and a pair of spaced apart flux return plates 44 (only one (1) flux return plate 44 is shown) which are secured to the drive housing 12.

The magnets 42 have pole faces of opposite polarity directly facing opposite legs of the coil 40. The resultant magnetic fields are such that current passing through the coil 40 in one (1) direction causes rotation of the actuator hub 36 in one (1) radial direction relative to the disks 14 (such as the radially outward direction) while reverse current causes reverse direction movement (such as the radially inward direction). Thus, the voice coil motor 34 is able to bi-directionally rotate the actuator hub 36 relative to the drive housing 12.

A read/write circuit assembly 45 carries or transmits the information between the computer or word processor and the storage disks 14. In the embodiment shown in the Figures, the read/write circuit assembly 45 includes the transducer assemblies 20, the flex inter-connect circuits 28, the circuit connectors 24 and the R/W flex circuit board 22.

Each transducer assembly 20 includes a load beam 46, a flexure 48, and a data transducer 50. The load beam 46 attaches the flexure 48 and the data transducer 50 to the actuator arm 18. Typically, each load beam 46 is flexible in a direction perpendicular to the storage disk 14 and acts as a spring for supporting the data transducer 50. As the disks 14 rotate, air flow between each data transducer 50 and the respective storage disk 14 causes the data transducer 50 to ride at an aerodynamically stabilized distance from the storage surface of the storage disk 14. Each load beam 46 is resilient and biased to urge each data transducer 50 towards the respective storage disk 14. A suitable load beam 46 can be obtained from Hutchinson Technology located in Hutchinson, Minn.

Each flexure 48 is used to attach one (1) of the data transducers 50 to one (1) of the load beams 46. Each flexure 48 can include a plurality of conductive flexure traces (not shown) which are electrically connected to the data transducer 50. Typically, each flexure trace can include a flexure connection pad (not shown) to facilitate attaching the flex inter-connect circuit 28 to the flexure 48. A suitable flexure 48 can be obtained from Hutchinson Technology located in Hutchinson, Minnesota.

Each data transducer 50 interacts with one of the storage surfaces on one of the storage disks 14 to access or transfer information to/from the storage disk 14. For a magnetic storage disk 14, the data transducer 50 is commonly referred to as a read/write head. To read or access data from a magnetic storage disk 14, the data transducer 50 produces electronic read signals as the data transducer 50 passes over the tracks on the surface of the rotating storage disk 14. To write or transfer data to the disk 14, the data transducer 50 generates a magnetic field which is capable of polarizing the desired region of the storage surface of the storage disk 14.

It is anticipated that the present device can be utilized for data transducers 50 other than read/write heads for a magnetic storage disk 14. For example, the present invention may be used with an electro-optical transducer for accessing data stored on optical storage disks.

The R/W flex circuit board 22 is connected to the external drive PCB which connects to a computer or word processor, and carries the information between the storage disk 14 and the computer or word processor. The design of the R/W flex circuit board 22 varies according to the design of the disk drive 10. For example, the R/W flex circuit board 22 can include a flexible printed circuit board ("FPCB") or an FPCB with a non-flexible ceramic circuit board attached. A suitable R/W flex circuit board 22 can be obtained from Dynaflex located in San Jose, Calif. Referring to FIGS. 1 and 2, the R/W flex circuit board 22 can be attached to the actuator assembly 16. Additionally, the R/W flex circuit board 22 can include connection pads (not shown) to facilitate attachment to the flex inter-connect circuit 28.

Figure 3:
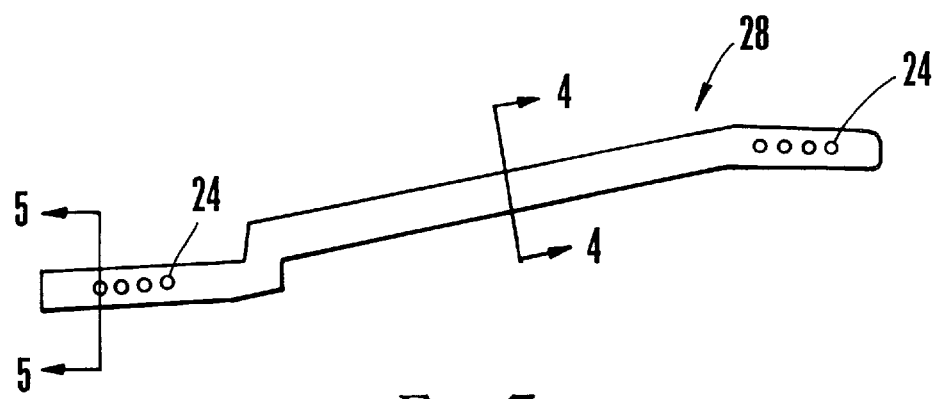
FIG. 3 is side plan view of a flex inter-connect circuit (FIC) and circuit connector having features of the present invention.

The flex inter-connect circuit 28, shown in FIG. 3, connects the R/W flex circuit board 22 to the transducer assembly 20. In the embodiment shown in the Figures, the flex inter-connect circuit 28 extends substantially the length of the actuator arm 18 and is positioned along an edge of the actuator arm 18. The flex inter-connect circuit 28 includes a trace 52, an insulator 54 which substantially encloses the trace 52, and a pair of substantially opposed inter-connect apertures 56a, 56b.

Figure 4:
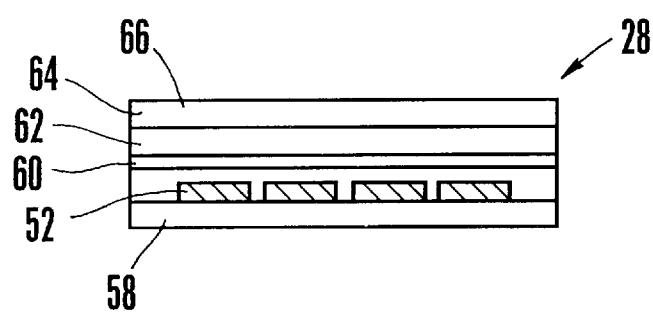
FIG. 4 is a cross-sectional view taken on line 4—4 of FIG. 3.

As shown in FIG. 4, the flex inter-connect circuit 28 can utilize a plurality of side-by-side traces 52 which are generally parallel and generally coplanar. Further, as shown in FIG. 4, the cross-section of each trace 52 can be rectangular. However, each trace 52 can be any other low profile shape.

Each trace 52 is electronically conductive and is typically made of copper. Preferably, the traces 52 are flexible, resilient, and can be pre-shaped to fit the actuator assembly 16. A layer of traces 52 can be etched from a solid layer of conductive material, or formed individually.

The insulator 54 substantially encompasses and coats the traces 52 to electrically isolate each of traces 52. The insulator 54 can be made from a number of dielectric materials and can be added to the traces 52 in multiple layers. For example, as shown in FIG. 4, the insulator 54 can include a base film layer 58 of polyimide with adhesive, a cover adhesive layer 60 which includes heat cured epoxy, and a cover film layer 62 made of polyimide. The FIC 28 can be formed by depositing or applying the layer of traces 52 onto the base film layer 58, or by etching traces from a conductive layer applied to the base film layer 58, and then insulating the layer of traces 52 by adhering the cover film layer 62 on the layer of traces 52 using the cover adhesive layer 60. A flex inter-connect circuit 28, including the traces 52 and the insulator 54, can be obtained from Sumitomo Electric Industries of Japan.

Importantly, the flexible inter-connect circuit 28 includes at least one (1) pair of substantially opposed, inter-connect apertures 56a, 56b which extend substantially through the insulator 54 to the trace 52. The pair of opposed inter-connect apertures 56a, 56b facilitate use of the circuit connector 24 described below. For convenience, the inter-connect aperture 56a shall be referred to as the first inter-connect aperture 56a while inter-connect aperture 56b shall be referred to as the second inter-connect aperture 56b.

The number of pairs of opposed inter-connect apertures 56a, 56b depends upon the design of the disk drive 10 and the number of traces 52. Generally, each trace 52 includes two (2) pairs of substantially opposed inter-connect apertures 56a, 56b. Since the flex inter-connect circuit 28, shown in FIGS. 3 and 4, includes four (4) traces 52, the flex inter-connect circuit 28 includes four (4) pairs of inter-connect apertures 56a, 56b to facilitate attachment of the flex inter-connect circuit 28 to the R/W flex circuit board 22 and four (4) pairs of inter-connect apertures 56a, 56b to facilitate attachment of the flex inter-connect circuit 28 to the flexure 48.

The size and shape of each inter-connect aperture 56a, 56b depends upon the intended use of the flex inter-connect circuit 28. For the disk drive 10 provided herein, each inter-connect aperture 56a, 56b has a substantially circular cross-section with an aperture diameter 64 of between about 0.12–0.20 mm. Alternately, for example, each inter-connect aperture 56a, 56b could have a substantially rectangular cross-section. Each pair of inter-connect apertures 56a, 56b can be cut into the insulator 54 with a laser (not shown). Alternately, those skilled in the art will recognize other ways to make the inter-connect apertures 56a, 56b.

Figure 6:
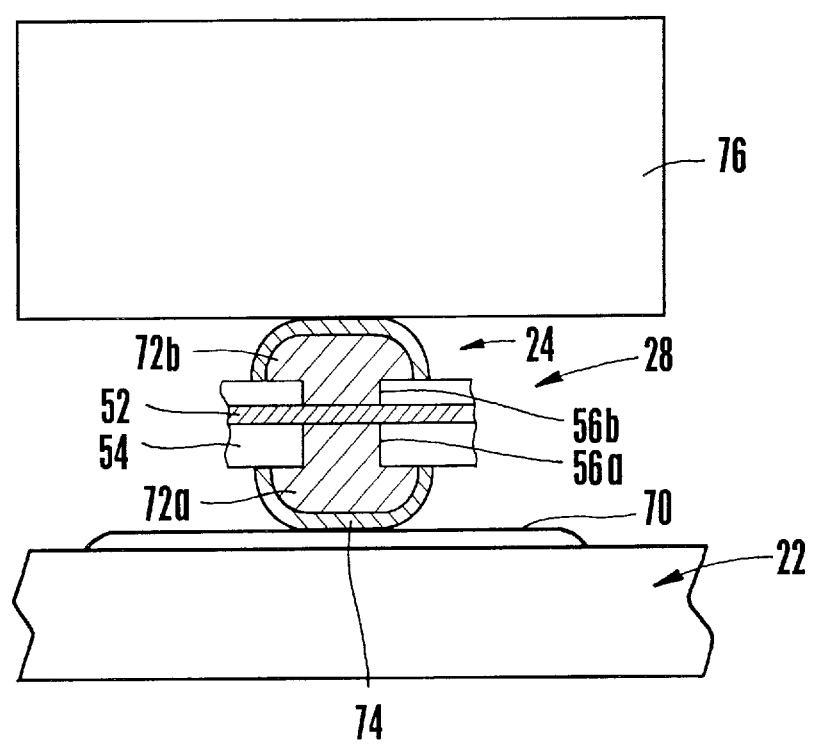
FIG. 6 is a cross-sectional view of FIG. 5, including a cross-sectional view of a heat source and an electronic circuit.

As can best be seen in FIG. 6, the circuit connector 24 electrically connects the FIC 28 to the R/W flex PCB 22. Typically, the R/W flex PCB 22 includes a connection pad 70 to facilitate attachment to the circuit connector 24. Alternatively, the circuit connector 24 can be used to electrically connect the FIC 28 to the flexure 48, which can also include a connection pad 70 to facilitate attachment of the circuit connector 24.

Figure 5:
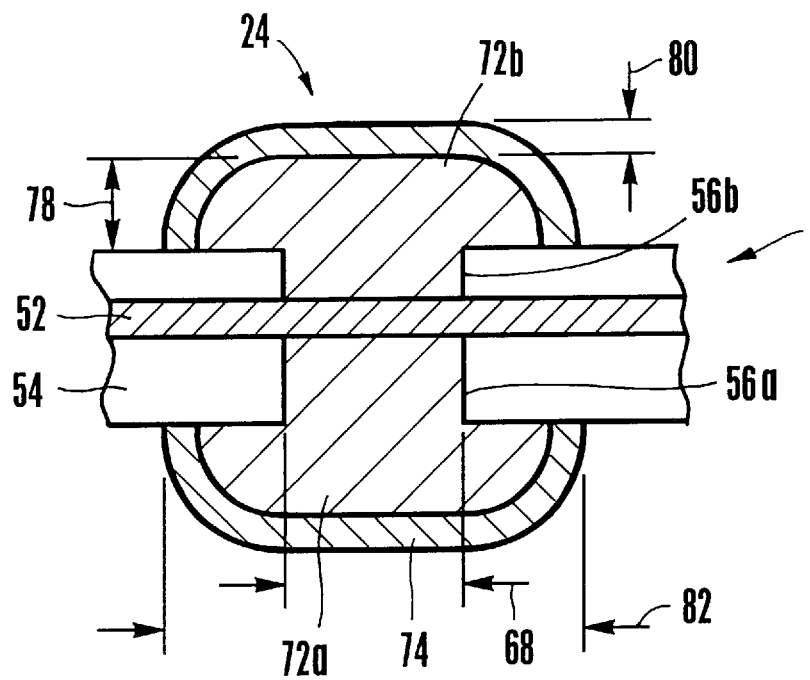
FIG. 5 is a cross-sectional view taken on line 5—5 of FIG. 3.

Referring to FIG. 5, each circuit connector 24 includes a pair of substantially opposed bumps 72a, 72b made from a bump material, which are covered with a coating of fusible material 74. For convenience, bump 72a shall be referred to as the first bump 72a while bump 72b shall be referred to as the second bump 72b.

Each bump 72a, 72b is disposed in one (1) of the pair of inter-connect apertures 56a, 56b. For example, the first bump 72a is disposed in the first inter-connect aperture 56a while the second bump 72b is disposed in the second inter-connect aperture 56b. Preferably, the first bump 72a extends past the insulator 54 to provide mechanical support and separation between the flex inter-connect circuit 28 and the R/W flex PCB 22 to prevent the fusible material 74 from being squeezed out from between the circuits during the bonding process. More preferably, the second bump 72b also extends past the insulator 54 to provide a surface for contact with a heat source 76 as provided below and shown in FIG. 6.

The bumps 72a, 72b are made of a bump material which has a relatively high melting point when compared to the fusible material 74. Suitable bump materials include copper, nickel, and alloys thereof. The bump material can be electroplated onto the trace 52.

The fusible material 74 can be any fusible material which facilitates bonding between the circuit connector 24 and the R/W flex circuit board 22. Preferably, the fusible material 74 has a relatively low melting point when compared to the melting point of the bump material since the bumps 72a, 72b support the circuit connector 24. Suitable fusible materials include silver, gold, tin, lead, and alloys thereof.

The number of circuit connectors 24 depends on the number of traces 52. Typically, each trace 52 includes two (2) circuit connectors 24. One (1) of the circuit connectors 24 is used to attach the trace 52 to the R/W flex circuit board 22, while the other circuit connector 24 is used to connect the trace 52 to the flexure 48. For example, as shown in FIG. 3, the flex inter-connect circuit 28 includes four (4) traces 52 and eight (8) circuit connectors 24.

The dimensions of each circuit connector 24 can vary according to the intended use of the circuit connector 24. For the disk drive 10 provided herein, each bump 72a, 72b has a bump height 78 of between about 30–70 microns, the coating of fusible material 74 has a fusible thickness 80 of between about 15–30 microns, and the circuit connector 24 has a connector diameter 82 of between about 0.25–0.50 mm.

As shown in FIG. 6, the heat source 76 contacts the second bump 72b and heats the circuit connector 24 to a temperature which is greater than the melting temperature of the fusible material 74 and less than the melt temperature of the bump material. This causes the fusible material 74 to melt. Upon removal of the heat source 76 from the second bump 72b, the fusible material 74 solidifies and forms the electrical and mechanical connection between the circuit connector 24 and the R/W flex circuit board 22. A hot bar or thermode makes an excellent heat source 76. Alternatively, the electrical and mechanical connection between the circuit connector 24 and the R/W flex circuit board 22 can be accomplished using an ultrasonic bonding apparatus which when energized causes the fusible material 74 to melt.

Since the present invention uses the second bump 72b substantially opposite the first bump 72a there is better heat transfer to the fusible material 74 which is adjacent the R/W flex circuit board 22. Thus, a lower temperature heat source 76 can be applied to the circuit connector 24. For the embodiment provided herein, a suitable temperature for a heat source 76 is between about 220°–240° C. With this heat source 76, the fusible material 74 proximate the R/W flex circuit board 22 begins to melt at about 185° C. Because of the lower temperature, there is less chance of thermal damage to the R/W flex circuit board 22 and/or the FIC 28. Further, the second bump 72b can be used as an electrical test point to test the R/W flex circuit board 22.

Although the circuit connector 24 provided herein is particularly useful for electrically and mechanically connecting the R/W flex circuit board 22 to the FIC 28 and/or the FIC 28 to the flexure 48 of the disk drive 10, the circuit connector 24 can be used in other applications. For example, it is believed that the circuit connector 24 can be used in conjunction with many flexible circuits (not shown) such as those present in consumer electronics.

Further, it is believed that the circuit connector 24 can be used to electrically connect to a pair of stacked circuit boards, either flexible or non-flexible types (not shown). For example, the second bump 72b can be bonded to a second electronic circuit board or to another connection point, or fusing pad, on the same circuit board, where the circuit board is a flexible circuit board, FPCB. In the case of the FPCB, by placing the FIC over the top of a connection pad on the FPCB then folding the FPCB over the top of the FIC, the FIC is sandwiched between the FPCB to form two connections. Such construction essentially creates a two trace layer FPCB from a single layer FPCB. These multiple layer FPCBs allow the traces to cross over each other without shorting.

OPERATION

As can best be seen with reference to FIG. 6, attachment of the flex inter-connect circuit 28 to the R/W flex circuit board 22 is accomplished by initially placing the coating of fusible material 74 adjacent the connection pad 70. Heat is then applied to the second bump 72b of the circuit connector 24 using the heat source 76. This causes the circuit connector 24 to heat to a temperature which is greater than the melting temperature of the fusible material 74 and less than the melting temperature of the bump material. This results in the melting of the fusible material 74 and the connection pad 70 of the R/W flex circuit board 22. Subsequently, the heat source 76 is cooled and removed and the circuit connector 24 is allowed to cool. Upon cooling, the fusible material 74 resolidifies and completes the connection. Further, the heat source 76 can be placed on the first bump 72a to unbond the flex inter-connect circuit 28.

Importantly, the unique design of the circuit connector 24, with the opposed bumps 72a, 72b, provides better heat transfer during the bonding process. This will result in more reliable and stronger bonds with less chance for heat damage to the R/W flex circuit board 22, the flex inter-connect circuit 28, or other parts. Furthermore, stronger bonds are achieved because the second bump 72b acts as a rivet or anchor which grabs the outside of the insulating layer of the FIC 28

While the particular circuit connector 24, as herein shown and disclosed in detail, is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A circuit connector for electrically connecting an electronic circuit to a flex inter-connect circuit, the flex inter-connect circuit including a trace which is substantially disposed within an insulator and a pair of substantially opposed inter-connect apertures which extend into the insulator to the trace, the circuit connector comprising:

a first bump and a substantially opposed second bump, each of the bumps being disposed in one of the inter-connect apertures; and a coating of fusible material which covers a portion of at least the first bump, the coating of fusible material having a lower melting point than the bumps bump and the coating of fusible material being adapted to attach the first bump to the electronic circuit.

2. The circuit connector of claim 1 wherein each of the bumps is attached to the trace.

3. The circuit connector of claim 1 wherein each of the bumps extends past the insulator.

4. The circuit connector of claim 1 wherein a coating of fusible material covers a portion of the second bump.

5. A flex inter-connect circuit including (i) a plurality of traces which are substantially enclosed within an insulator, each trace including a first inter-connect aperture and a substantially opposed, second inter-connect aperture, each of the inter-connect apertures extending substantially through the insulator to the trace and (ii) the circuit connector of claim 1, having the first bump positioned within at least a portion of the first inter-connect aperture and the second bump positioned within at least a portion of the second inter-connect aperture.

6. A flex inter-connect circuit including (i) a trace which is substantially enclosed within an insulator, (ii) a first inter-connect aperture and a substantially opposed second inter-connect aperture, each inter-connect aperture extending substantially through the insulator to the trace, and (iii) the circuit connector of claim 1, having the first bump positioned within at least a portion of the first inter-connect aperture and the second bump positioned within at least a portion of the second inter-connect aperture.

7. A read/write circuit including (i) a circuit board and (ii) the flex inter-connect circuit of claim 6, wherein the first bump and the coating of fusible material are attached to the circuit board.

8. A read/write flex circuit including (i) a flexure, and (ii) the flex inter-connect circuit of claim 6, wherein the first bump and the coating of fusible material are attached to the flexure.

9. An actuator assembly including (i) an actuator arm, and (ii) the read/write circuit of claim 8 secured to the actuator arm.

10. A disk drive including (i) a drive housing, and (ii) the actuator assembly of claim 9 positioned within the drive housing.

11. A flex inter-connect circuit for electrically connecting to an electronic circuit, the flex inter-connect comprising:

a trace which is substantially enclosed within an insulator;

a first pair of substantially opposed inter-connect apertures which extend substantially through the insulator to the trace; and a first circuit connector comprising (i) a first bump contacting the trace and extending from one of the inter-connect apertures, (ii) a second bump positioned in one of the inter-connect apertures substantially opposite the first bump; and (iii) a coating of fusible material which covers a portion of the first bump and is adapted to attach the first bump to the electronic circuit, the coating of fusible material having a lower melting point than the bumps.

12. A read/write circuit assembly for a disk drive, the read/write circuit assembly including (i) a transducer assembly having a flexure and (ii) the flex inter-connect circuit of claim 11, wherein the first bump and coating of fusible material are attached to the flexure.

13. The read/write circuit assembly of claim 12 including a circuit board; wherein the flex inter-connect circuit includes a second pair of substantially opposed inter-connect apertures which extend substantially through the insulator to the trace and a second circuit connector, the second circuit connector having (i) a pair of substantially opposed bumps, each bump contacting the trace and extending from one of the second pair of inter-connect apertures, and (ii) a coating of fusible material which covers a portion of one of the bumps and electrically connects one of the bumps to the circuit board.

14. A disk drive including (i) a drive housing, and (ii) the read/write circuit assembly of claim 13 positioned within the drive housing.

15. An actuator assembly for a disk drive, the actuator assembly comprising:

an actuator arm;

a transducer assembly attached to the actuator arm;

a circuit board mounted proximate the actuator arm;

a flex inter-connect circuit including a trace which is substantially enclosed within an insulator and a first pair of substantially opposed inter-connect apertures which extend substantially through the insulator to the trace; and a first circuit connector including (i) a pair of substantially opposed bumps, each bump contacting the trace and extending from one of the inter-connect apertures, and (ii) a coating of fusible material having a lower melting point than the bumps, the coating of fusible material covering a portion of one of the bumps and electrically connecting the first circuit connector to the circuit board.

16. The actuator assembly of claim 16 wherein (i) the transducer assembly includes a flexure, (ii) the flex inter-connect circuit includes a second pair of substantially opposed inter-connect apertures which extend substantially through the insulator to the trace, and (iii) the actuator assembly includes a second circuit connector having a pair of substantially opposed bumps, each bump contacting the trace and extending from one of the second pair of inter-connect apertures and a coating of fusible material which covers a portion of one of the bumps and electrically connects the second circuit connector to the flexure.

17. A disk drive including the actuator assembly of claim 16.

18. A method for connecting an electronic circuit to a flex inter-connect circuit, the flex inter-connect circuit including a trace which is substantially enclosed within an insulator, a pair of substantially opposed inter-connect apertures which extend substantially through the insulator to the trace and a circuit connector comprising a pair of substantially opposed bumps, each bump contacting the trace and extending from one of the inter-connect apertures and a coating of fusible material which covers a portion of one of the bumps and is adapted to attach the bump to the electronic circuit, the coating of fusible material having a lower melting point than the bumps, the method including the steps of:

positioning one of the bumps adjacent the electronic circuit; and heating the other bump to create the bond between the circuit connector and the electronic circuit.

19. A method for making a circuit connector for a flex interconnect circuit, the flex inter-connect circuit including a trace which is substantially enclosed within an insulator and a pair of substantially opposed inter-connect apertures which extend substantially through the insulator to the trace, the method including the steps of:

attaching a pair of opposed conductive bumps onto the trace, each bump being electrically conductive and being disposed in one of the inter-connect apertures; and coating at least a portion of one of the bumps with a fusible material, the coating of fusible material having a lower melting point than the bumps.

20. A method for connecting an electronic circuit to a flex inter-connect circuit, the flex inter-connect circuit including (i) a trace which is substantially enclosed within an insulator, (ii) a first inter-connect aperture and a second inter-connect aperture, each inter-connect aperture extending substantially through the insulator to the trace and (iii) a circuit connector comprising a first bump and a coating of fusible material, the first bump contacting the trace and being positioned in the first inter-connect aperture, the coating of fusible material covering a portion of the first bump and being adapted to attach the first bump to the electronic circuit, and a second bump contacting the trace and being positioned in the second inter-connect aperture, the coating of fusible material having a lower melting point than the bumps, the method including the steps of:

positioning the first bump adjacent the electronic circuit; and heating the second bump positioned within the second inter-connect aperture to create the bond between the circuit connector and the electronic circuit.

* * * * *